United States Patent [19]

Dafter, Jr.

[11] 4,084,023
[45] Apr. 11, 1978

[54] METHOD FOR DEPOSITING A METAL ON A SURFACE

[75] Inventor: Robert Vincent Dafter, Jr., Ewing Township, Mercer County, N.J.

[73] Assignee: Western Electric Company, Inc., New York, N.Y.

[21] Appl. No.: 714,455

[22] Filed: Aug. 16, 1976

[51] Int. Cl.² .............................................. C23C 3/02
[52] U.S. Cl. ..................................... 427/98; 96/36.2; 106/1.11; 427/53; 427/54; 427/304; 427/305; 427/306
[58] Field of Search .............................. 427/304–306, 427/98, 96, 97, 53, 54; 96/36.2; 106/1.11

[56] References Cited

U.S. PATENT DOCUMENTS

| 3,011,920 | 12/1961 | Shipley, Jr. | 427/304 |
|---|---|---|---|
| 3,488,166 | 1/1970 | Kovac | 29/197 S |
| 3,597,266 | 8/1971 | Leibowitz | 427/304 |
| 3,745,039 | 7/1973 | Feldstein | 427/305 |
| 3,772,056 | 11/1973 | Polichette | 427/304 |
| 3,772,078 | 11/1973 | Polichette | 427/304 |
| 3,859,092 | 1/1975 | Gyrling | 204/15 |
| 3,904,783 | 9/1975 | Nara | 427/54 |
| 3,907,621 | 9/1975 | Polichette | 156/18 |
| 3,925,578 | 12/1975 | Polichette | 427/304 |
| 3,930,963 | 1/1976 | Polichette | 204/15 |

*Primary Examiner*—Ralph S. Kendall
*Assistant Examiner*—John D. Smith
*Attorney, Agent, or Firm*—J. Rosenstock

[57] ABSTRACT

A method for depositing a metal on a surface is disclosed. The method comprises coating the surface with a sensitizing solution comprising at least a reducible salt of a non-noble metal to form a coated surface. The coated surface is exposed to a source of light radiation to form a catalytic layer capable of directly catalyzing the deposition of a metal thereon from an electroless metal deposition solution. The catalytic layer is treated with a fixing solution comprising an autocatalytic reducing agent for the non-noble metal ions of said reducible salt to at least stabilize the catalytic layer.

12 Claims, No Drawings

METHOD FOR DEPOSITING A METAL ON A SURFACE

BACKGROUND OF THE INVENTION

1. Field of the Invention

This invention relates to a method of depositing a metal on a surface and more particularly, to a method of selectively depositing an electroless metal deposit on a surface.

2. Discussion of the Prior Art

Heretofore, it has been known to employ a number of pretreatment or sensitization baths in effecting the electroless deposition of metals on various surfaces. Typically, such prior art sensitization baths used commercially have been expensive because they depend upon a noble metal, e.g., Pd, Pt, Ag, Au, etc., as the sensitizing component. However, recently methods have been reported in which electroless metal deposits can be applied to a broad variety of insulating substrates without the need to use expensive nobel metals but on the contrary, employ reducible salt compositions of non-noble metals. U.S. Pat. Nos. 3,772,056; 3,772,078; 3,907,621; 3,925,578; and 3,930,963 disclose such methods. A problem with the methods disclosed in these patents and not recognized or addressed thereby or therein is that of moisture or humidity which affects a catalytic real image formed by the methods and the resultant electroless metal deposit.

U.S. Pat. No. 3,859,092 discloses metallizing a latent image, formed by actinic radiation exposure of a copper (I) complex or coordination compound by treating the latent image with a chemical developer containing a reducing agent for ions contained in the latent image. However, it has not heretofore been know how to fix or stabilize the real image, produced by the methods of the patents referred to in the preceding paragraph, in the presence of non-noble metal ions which are not bound up, as by being complexed or coordinated. Accordingly, a method of fixing or stabilizing the real image is needed and is an object of this invention.

SUMMARY OF THE INVENTION

A method of depositing a metal on a surface includes coating the surface with a sensitizing solution comprising at least a reducible salt of a non-noble metal to form a coated surface. The coated surface is exposed to a source of light radiant energy to form a catalytic layer capable of directly catalyzing the deposition of a metal thereon from an electroless metal deposition solution. The catalytic layer is treated with a fixing solution comprising an autocatalytic reducing agent for the non-noble metal ions of the reducible salt to at least stabilize the catalytic layer.

DETAILED DESCRIPTION

The present invention will be discussed primarily in terms of selectively depositing copper on a surface of an apertured substrate. It will be readily appreciated that the inventive concept is equally applicable to depositing other suitable metals which are catalytically reduced from their respective ions by the catalytic surface areas produced by the subject invention. It will also be appreciated that the selective deposition is not limited to any one particular type of surface but is applicable to metallizing any surface whether used as a printed circuit board or not.

The present invention relates to imposing by radiant energy sensitive, non-conductive areas on the surfaces of a substrate which catalyze the deposition of strongly adherent and continuous deposits of electroless metal. U.S. Pat. Nos. 3,772,056; 3,772,078; 3,907,621; 3,925,578; and 3,930,963, all of which are incorporated hereinto by reference, disclose a method of selectively metallizing a surface by coating with a composition comprising at least a reducible salt of a non-noble metal selected from copper, nickel, cobalt or iron, which is then converted by reduction of the salt by exposure to a source of radiant energy to electrically non-conductive reduced metal species nuclei, believed to be metal nuclei, capable of catalyzing the deposition thereon of a metal from an electroless metal deposition solution. However, it has been found that the method (exposure to radiant energy) disclosed in the above-identified patents, incorporated by reference hereinto, does not successfully work in that when the radiation-exposed surface is allowed to age and/or is water rinsed and/or is exposed to high humidity exposure, the resultant surface loses its catalytic ability. The subject invention obviates this problem.

A suitable substrate is first selected. Typical suitable substrates include bodies comprising inorganic and organic substances, such as glass, ceramics, porcelain, resins, paper, cloth and the like. Metal-clad or unclad substances of the type described may be used.

For printed circuits, among the materials which may be used as the bases, may be mentioned metal-clad or unclad insulating thermosetting resins, thermoplastic resins and mixtures of the foregoing, including fiber, e.g., fiberglass, impregnated embodiments of the foregoing.

Included in the thermoplastic resins are acetal resins; acrylics, such as methyl acrylate; cellulosic resins, such as ethyl cellulose, cellulose acetate, cellulose propionate, cellulose acetate butyrate, cellulose nitrate, and the like; polyethers; nylon; polyethylene; polystyrene; styrene blends, such as acrylonitrile styrene and copolymers and acrylonitrile-butadiene styrene copolymers; polycarbonates; polychlorotrifluoroethylene; and vinyl polymers and copolymers, such as vinyl acetate, vinyl alcohol, vinyl butyral, vinyl chloride, vinyl chloride-acetate copolymer, vinylidene chloride and vinyl formal.

Among the thermosetting resins may be mentioned allyl phthalate; furane; melamine-formaldehyde; phenol formaldehyde and phenolfurfural copolymers, alone or compounded with butadiene acrylonitrile copolymers or acrylonitrile-butadiene-styrene copolymers; polyacrylic esters; silicones; urea formaldehydes; epoxy resins; allyl resins; glyceryl phthalates; polyesters; and the like.

Porous materials, comprising paper, wood, fiberglass, cloth and fibers, such as natural and synthetic fibers, e.g., cotton fibers, polyester fibers, and the like, as well as such materials themselves, may also be metallized in accordance with the teachings herein. The invention is particularly applicable to the metallization of resin-impregnated fibrous structures and varnish-coated, resin-impregnated fiber structures of the type described.

Since radiant energy, such as ultraviolet radiation, is to be employed, preferred substrates are those which are opaque to the transmission of radiant energy. This prevents "printing through" and also facilitates simultaneous or sequential formation of images and circuits or both major surfaces of the board. The substrate surfaces can be rendered opaque to light energy mechanically, i.e., by frosting with sandblasting and the like, or chemically by etching with appropriate reagents, such as chromic acid for resins and hydrogen fluoride for glass, alkali for porcelain, and the like. Frosted surfaces will scatter rather than absorb incident energy. On the other hand, energy absorbing substances can be dispersed in the substrate or adsorbed on the surface thereof to render the substrate opaque. By way of illustration, pigments, such as carbon black and titanium dioxide, are useful to prevent penetration by light in the visible wavelengths; bismuth, tin, lead and thorium compounds, as well as organic iodine compounds are useful as X-ray radiation and electron barriers. Lead compounds are useful neutron shields. The substrate can be rendered opaque to light energy, particularly at visible or ultraviolet wavelengths with a conventional compound, such as hydroxy benzophenone, a hydroxy benzotriazole or a substituted acrylate, and the like.

A surface of the substrate is selectively deposited with an electrically non-conductive layer or real image comprising nuclei of a metal species, typically the metal which is capable of catalyzing the deposition of electroless metal from an electroless metal deposition solution with which it is destined to be exposed or treated.

The real image typically comprises metal species nuclei, e.g., metal nuclei, in which the metals are selected from Groups VIII and IB of the Periodic Table of Elements. Preferred metals are selected from Period 4 of Groups VIII and IB; iron, cobalt, nickel and copper. Especially preferred for the production of the real image is copper.

If desired the surface can be coated with an adhesive before being coated with the compositions of this invention.

In producing the real image, the metal species nuclei are reduced from their salt or a composition of the salt in situ in selected areas on the surface of the substrate by application of light radiant energy, such as ultraviolet light and visible light, X-rays, electron beams, and the like.

The reducible metal salt can comprise, in general, a cation selected from the metals of Group VIII and IB of the Periodic Table of the Elements. The anion associated in such metal salts can vary widely and can comprise organic and inorganic anions such as halides, sulfates, a nitrates, formates, gluconates, acetates and the like. The cations in such salts will include copper, nickel, cobalt and iron, in any of the usual degrees of oxidation, e.g., both cuprous and cupric, ferrous and ferric, etc., will serve. Some typical salts include cupric formate, cupric gluconate, cupric acetate, cupric chloride, cupric nitrate, nickel chloride, cobalt chloride, ferrous sulfate and cobalt chloride.

The surface of the substrate, if necessary, is cleaned as described in the patents incorporated hereinto by reference. A sensitizing solution of a reducible metal salt composition, e.g., cupric formate, and a radiant energy-sensitive reducing agent contained in a suitable solvent, e.g., water, an alcohol, dimethyl formamide, dimethyl sulfoxide or the solvents described in copending application Ser. No. 693,600, assigned to the assignee hereof and incorporated by reference hereinto, is applied to the surface to form a sensitizing solution layer. The coated surface is typically dried and then exposed through a positive or negative of an original pattern or photograph, to form the real image on selected portions of the surface. The real image comprises reduced metal salt species nuclei, e.g., copper metal nuclei.

The radiant energy sensitive compound used in association with the reducible metal has the property of decomposing to a compound which will exercise a reducing action on the exposed metal salt. Such radiant energy-sensitive compounds form a family of scope well known to those skilled in the art. Among them may be mentioned ferric salts, dichromate compounds, anthraquinone and its compounds, amino acids, such as glycine, unsaturated organic compounds such as L-ascorbic acid, cinnamic acid, stilbenes, or azide compounds and the like. Because visible and ultraviolet light are the most convenient sources of radiant energy, the solutions used in this invention preferably contain such compounds which are sensitive to visible or ultraviolet light. Especially preferred are ferric salts, dichromates, anthraquinone and derivatives thereof. Illustrative among these are:

(a) ferric salts, such as ferric ammonium citrate (green or brown), ferric potassium citrate, ferric ammonium oxalate, ferric sodium oxalate, ferric potassium oxalate, ferric ammonium tartrate, ferric citrate, ferric oxalate, ferric chloride, ferric ammonium sulfate and the like;

(b) bichromate salts, such as those of the general formula $Me_2CrO_3 \cdot CrO_4$ wherein Me is any common metal cation, such as alkali metal, alkaline earth metal; ammonium or substituted ammonium, and the like. Some typical salts include sodium bichromate, potassium bichromate, or mixtures thereof with organic substances of animal or vegetable origin such as gelatin, fish glue, gum arabic, shellac, and the like, such as bichromated starch, and the like; and (c) anthraquinone or derivatives thereof, such as 9,10-anthraquinone, $\beta$-chloroanthraquinone, $\beta$-phenylanthraquinone, 1,2-benzanthraquinone, anthraquinone-2-sulfonic acid, anthraquinone-2,6 (or 2,7-)-disulfonic acid, salts thereof, and particularly anthraquinone 2,6-disodium sulfonate, anthraquinone-2,7-disodium sulfonate, anthraquinone-2,7-dipotassium sulfonate, and the like. Other useful radiant energy-sensitive compounds will suggest themselves to those skilled in the art, and a wide variety of such compounds are shown, for example, in standard reference works such as J. Kosar, *Light Sensitive Systems*, John Wiley & Sons, New York (1965).

A preferred additional ingredient in the treating composition is a secondary reducer, such as an organic, oxygen- or nitrogen-containing compound. Such an ingredient serves to facilitate interaction of radiant energy and the radiant energy-sensitive compound to provide a reduction of the metal salt to the free metal nuclei. Although the secondary reducer compound may be any oxidizable organic compound which is soluble in the solution, does not attack the base material, and is inert to the other ingredients, it is preferred that it comprise a hydroxy compound such as an alcohol or a polyol. Especially preferred as secondary reducing compounds are alcohols or polyols. Among the organic oxygenated compounds can be mentioned glycerol, ethylene glycol, pentaerythritol, mesoerythritol, 1,3-propanediol, sorbitol, mannitol, 1,2-butanediol, pinacol, sucrose, dextrin, polyethylene glycols, lactose, starch, gelatin, and the like. Also included are compounds such as triethanolamine and propylene oxide. Compounds which are also useful as secondary reducers are amino compounds, polyethers, certain dyestuffs and pigments. Among these may be mentioned aldehydes, such as formaldehyde, benzalhyde; acetaldehyde; N-butyraldehyde, polyamides, such as nylon, albumin and gelatin; leuco bases of triphenylmethane dyes, such as 4-dimethylaminotriphenylmethane; leuco bases of xanthene dyes, such as 3,6-bisdimethylaminoxanthane and 3,6-bisdimethylamino-9-(2-carboxyethyl)xanthene; polyethers, such as ethylene glycol diethyl ether, tetraethylene glycol dimethylether, alizarin, erythiocin, phthalocyanine blue, zirconium silicate and the like.

Additionally, other ingredients known as metal reduction intensifiers/accelerators/stabilizers may be added to the treating sensitizing solution to provide at least one of the following effects: (1) speed-up the exposure time, (2) help bring out the real image and provide better contrast, (3) provide anti-fogging, (4) lead to better definition and (5) stabilize the real image. For example, image formation can be accelerated; contrast can be improved, the need for the heat intensification can be eliminated and the stability of the image enhanced if to the solution comprising the metal salt and radiant energy-sensitive compound are added halogens, e.g., bromides and chlorides, alone or in combination with metals such as tin, alkali metals, mercury, germanium, titanium, molybdenum, rare earths, amines, ammonia and the like. Illustrative of such compounds are: hydrogen halides and alkali metal or alkaline earth metal halides, ammonia or amine halides and the like. Particularly preferred are stannous chloride, hydrogen chloride, hydrogen bromide, potassium chloride and potassium bromide. In some embodiments the recited compounds may be used with organic acids such as mono-, di-, tri-carboxylic acids or salts thereof and the like, for example, with acetic acid, citric acid, oxalic acid and the like.

A particularly effective additive has been found to be ferrithiocyanide compounds, e.g., potassium ferrithiocyanide.

In addition to the metal reduction image intensifiers-/accelerators/stabilizers, the composition comprising the metal salt and the radiant energy-sensitive compound can include also a surfactant, for those surfaces which are hard to wet with the particular sensitizing solution employed. The choice of the surfactant is not particularly critical, but usually it is preferred to use a non-ionic surfactant, because this permits a broader range in formulation. Among the suitable surfactants are polyethyleneoxy non-ionic ethers such as Triton-X 100, manufactured by Rohm & Haas Company, and non-ionic surfactants based on the reaction between nonylphenol and glycidol such as surfactants 6G and 10G manufactured by the Olin Company. Also suitable are fluorocarbon surfactants such as perfluorodecanoic acid and the series of related compounds manufactured by the 3M Company under the product designation FC-170 and the like.

The treating sensitizing solution may be formulated within broad concentration ranges, depending primarily on the relative amount of metal salt compostion desired to be placed on the surface, which in turn will depend on the mode of application, e.g., immersion, dip coating, roller coating, curtain coating, spraying and the like. In addition, the concentration of the ingredients in solution will be limited by solubility in the solvent. In general, the metal salt concentration will be predetermined and the amounts of radiant energy-sensitive compound and other ingredients, if present, will be adjusted to provide a ratio which will insure the desired result. This is well within the skill of those familiar with the art of formulating radiant energy-sensitive systems. For example, at least enough radiant energy-sensitive compound will be present to facilitate substantially complete reduction by exposure to radiant energy of the metal salt to the free metal nuclei. Usually to insure complete reduction, a substantial excess of the radiant energy-sensitive compound (based on the reducible metal ions) will be present. The metal salt concentration in solutions can vary over wide limits, e.g., from 0.5 to 100 grams or more per liter can be used but it is most convenient and economical not to use more than about 25 grams per liter and preferably less than about 15 grams per liter. The radiant energy-sensitive compound can comprise from about 1 to 10 or more equivalents, based on the metal salt. The amount of the secondary reducer, e.g., glycerol, sorbitol pentaerythritol, dyestuff or the like, can likewise vary over a wide range, e.g., from 0.5 to 500 grams per liter, but in the case of difficult to volatilize liquid compounds, it is preferred not to include so much of such compounds that the treated surface is wet or sticky to the touch after drying. The ingredients, such as halide ions, stannous halides and carboxylic acids added to the compositions as image intensifiers, accelerators, stabilizers, etc., will generally be used in relatively low concentrations, e.g., from trace amounts, e.g., from about 1 mg. per liter up to about 2 grams per liter. The amount of ferrithiocyanide compounds ranges from 50 to 150 parts per million. Surfactants will be used in small, but conventional quantities, if present. The non-ionics will be used at levels from about 0.1 to 2 grams per liter and anionics from about 0.1 to 1.0 grams per liter.

The resultant real image is catalytic to electroless metal deposition and can be processed in known ways from the subsequent build-up of electroless metal plating and, optionally, a top layer of electroplating. Typically, the surface having the real image thereon is rinsed in running water to remove the background, i.e., to wash out the unexposed (unreduced) portion of the sensitizing solution layer, and then immersed in a suitable electroless metal deposition solution to deposit an electroless metal deposit thereon. However, it has been found that if the water rinsing is carried out for too long a period of time, e.g., 10 seconds to 2.5 minutes, or the real image containing surface is allowed to age and/or is exposed to high humidity conditions, e.g., 24 hours at 25° C. and a relative humidity of 45%, the real image fades and may disappear altogether resulting in either an incomplete electroless metal deposit containing voids or no electroless metal deposit at all. In this regard, it is to be noted that it has been observed that when the prolonged water rinsed or aged surface is immersed in an electroless plating bath, the resultant faded image may fade to an even greater extent or partially dissolve. It has surprisingly been found that such problems, due to prolonged water rinsing, due to aging and/or high humidity exposure can be eliminated by fixing the real image with a fixing solution.

After exposure to the radiant energy source, the real image is treated with a fixing solution comprising a suitable autocatalytic reducing agent for the non-noble metal ions of the metal salt contained on the surface. An autocatalytic reducing agent is one which reduces a metal ion, e.g., $Cu^{+2}$, to its corresponding metal, e.g., $Cu°$, by the presence of the corresponding metal (catalyst), e.g., $Cu°$. Such autocatalytic reducing agents are well known in the art of electroless metal deposition. Where copper salts are used in the sensitizing solution of the subject invention, typical autocatalytic reducing agents include, under alkaline aqueous conditions (pH>7), formaldehyde and paraformaldehyde. Where nickel and cobalt salts are used in the sensitizing solution of the subject invention, typical autocatalytic reducing agents include, under alkaline aqueous conditions (pH>7), formaldehyde and paraformaldehyde, and under acidic aqueous conditions (pH>7) hypophosphite species, e.g., sodium hypophosphite, potassium hypophosphite, etc.

What reducing agents are autocatalytic with respect to a particular metal ion and the conditions for such a reduction are well known to those skilled in the art or are easily ascertainable by those skilled in the art in the light of the disclosure contained herein.

The autocatalytic reducing agent reduces those non-noble metal ions contained in the real image which were not reduced by the radiant energy exposure thereby fixing or reinforcing the real image. Only those ions contained within the real image are so reduced since only the reduced non-noble metal salt species, e.g., copper metal, contained within the real image catalyzes the reduction. Areas other than the radiant energy exposed areas or the real image areas contain non-noble metal ions but do not contain reduced non-noble metal salt species, e.g., copper metal, and are not so reduced by the autocatalytic reducing agent.

The fixing solution may also comprise a conventional complexing or chelating agent for the non-noble metal ions. For copper ions, suitable complexing or chelating agents include ethylenediaminetetracetic acid (EDTA), triethonolamine, etc. Such complexing agents may readily be found by those skilled in the art by reference to standard works, such as, for example, W. Goldie, *Metallic Coating of Plastics*, Volume 1, Electrochemical Publications, Limited, Middlesex, England, 1968.

It is to be pointed out and stressed hereat that the fixing solution is not an electroless metal deposition solution. The fixing solution does not contain additional non-noble metal ions, e.g., $Cu^{+2}$, $Ni^{+2}$, etc., along with the reducing agents. The only non-noble metal ions which are present and which are reduced or fixed are those already contained on the surface of the substrate and in particular those ions comprising and contained within the boundaries of the real image.

The surface containing the real image is treated, e.g., by immersion, with the fixing solution for a period of time, e.g., typically 90 seconds and at a temperature, e.g., typically 20° to 35° C., to fix the real image.

The fixing solution serves another purpose besides fixing the real image, it serves to wash out or remove the unexposed (as well as unfixed) portions of the sensitizing layer. The fixed real image surface can be directly immersed or treated with an electroless metal deposition solution without additional rinsing steps. The fixed surface can however be water rinsed or rinsed with any other inert rinsing agent without fear of losing the real image. The fixed image containing surface (which may be water rinsed) is then immersed in a suitable electroless metal deposition solution to deposit an electroless metal deposit on the fixed image.

Suitable electroless metal deposition solutions are well known in the art and will not be elaborated herein. Reference in this regard is made to the patents incorporated hereinto by reference, which disclose some suitable electroless metal deposition solutions.

The electroless metal deposit may be built up to a desired thickness by prolonged exposure to the electroless metal deposition solution or, alternatively, may be further built up by being electroplated in a standard electroplating bath. Again, the various typical electroplating solutions, plating conditions and procedures are well known in the art and will not be elaborated herein. Again, reference in this regard is made to U.S. Pat. Nos. 3,772,056; 3,772,078; 3,907,621; 3,925,578; and 3,930,963, incorporated hereinto by reference.

In an alternate embodiment, the surface of the substrate is imprinted or selectively stamped with the sensitizing solution. The surface is then exposed to the source of radiant energy to form the real image. The real image is then fixed on the surface with the fixing solution. The fixed image surface may then be water rinsed and is then immersed or treated with the electroless metal deposition solution.

It is of course to be understood that the substrate may be blanket metallized, the substrate being dip coated with the sensitizing solution comprising at least the reducible metal salt. The coated substrate is then exposed to a radiant energy, e.g., ultraviolet radiation, agent to form a catalytic surface. The catalytic surface is fixed by immersion in a bath comprising the fixing solution and then electrolessly metal deposited. If it is desired to pattern the metal deposit, conventional subtractive techniques can be employed, such as conventional masking and etching techniques.

EXAMPLE I

A substrate comprising a steel core with a fully cured diglycidyl ether of bisphenol A coating thereon was selected. The substrate comprised about 200 through holes having a diameter of about 0.050 inch. The substrate was immersed in a solvent bath comprising methyl ethyl ketone for ten minutes at 25° C. The substrate was water rinsed for one minute at 25° C. and then etched in an aqueous solution comprising 360 grams $CrO_3$, 250 grams $H_3PO_4$ and 180 grams $H_2SO_4$ in 1000 ml. of water, maintained at 25° C. for 10 minutes. The etched substrate was then water rinsed at 25° C. for 10 minutes.

A sensitizing solution was prepared by dissolving 21.5 grams of cupric formate, 16 grams of 2,6-anthraquinone disulfonic acid disodium salt, 50 ml. of butanol and 66 grams of sorbitol in a solvent comprising 950 ml. of $H_2O$. The etched substrate was immersed in the sensitizing solution for 1 minute at 25° C., removed therefrom and dried at 90° to 100° C. for 3 minutes. A surface of the dried substrate was selectively exposed to a high-pressure mercury discharge lamp (30 watts/$cm^2$ surface at 3660A.) for 90 seconds to form a real imaged. The imaged surface was then rinsed at 25° C. for 0.5 minute. The real image faded upon the rinsing. The surface was then immersed in a conventional electroless metal deposition solution comprising cupric sulfate, formaldehyde, sodium cyanide, alkali and EDTA. An electroless metal deposit was not obtained.

EXAMPLE II

The procedure of Example I was repeated except that prior to exposure to water, the real image was fixed by immersion thereof in a fixing solution comprising (1) 900 ml. of water, (2) 100 ml. of 37 weight percent aqueous formaldehyde, and (3) 2 to 5 grams of EDTA. The pH of the resultant solution was adjusted to 12.5 by the addition thereto of 32 ml. of 10N NaOH (aqueous). The immersion in the fixing solution was for 30 seconds at 30° to 35° C. The real image became darker in color.

The fixed image containing surface was water rinsed for 2.5 minutes. An electroless copper deposit was obtained.

EXAMPLE III

The procedure of Example II was repeated except that the fixing solution did not contain EDTA. Essentially the same results were obtained as in Example II.

It is to be understood that the above-described embodiments are simply illustrative of the principles of the invention. Various other modifications and changes may be made by those skilled in the art which will embody the principles of the invention and fall within the spirit and scope thereof.

What is claimed is:

1. A method for selectively metallizing a surface of a substrate comprising the steps of:
    (a) depositing on the surface a layer of a sensitizing composition by treating the surface with a solution comprising at least (a') a reducible salt of a non-noble metal, selected from the group consisting of a reducible salt of copper, a reducible salt of nickel and a reducible salt of cobalt and (b') a light radiation sensitive reducing agent for said salt;
    (b) exposing said layer-deposited surface to a source of light radiant energy to reduce said metal salt to a reduced metal salt species and wherein at least one of said treating steps is restricted to a selected pattern on the surface to produce a real image of the reduced metal salt species in the selected pattern which is capable of directly catalyzing the deposition thereon of a metal from an electroless metal deposition solution; and
    (c) treating said real image containing surface, prior to exposure thereof to an electroless metal deposition solution, with a fixing solution comprising a reducing agent selective for the non-noble metal ions of the salt, contained within the real image, selected from the group consisting of formaldehyde and paraformaldehyde when said salt is a reducible salt of copper, and formaldehyde, paraformaldehyde and a hypophosphite species when said salt is a reducible salt of nickel or cobalt, to stabilize the pattern.

2. The method as defined in claim 1 which further comprises exposing the real image to an electroless metal deposition solution to deposit an electroless metal deposit thereon.

3. The method as defined in claim 1 wherein said metal salt is reduced by selective exposure to ultraviolet radiation.

4. The method as defined in claim 1 wherein said sensitizing solution comprises the reducible metal salt, said light radiation-sensitive reducing agent for said salt and a secondary reducer.

5. The method as defined in claim 4 wherein said light radiation-sensitive reducing agent is a light-sensitive reducing compound of the group consisting of ferric salts, dichromates, anthraquinone disulfonic acids and salts, glycine and L-ascorbic acid, and said secondary reducer comprises a polyhydroxy alcohol.

6. The method as defined in claim 1 wherein:
    said salt comprises a reducible salt of copper; and
    said reducing agent is selected from the group consisting of formaldehyde and paraformaldehyde.

7. In an improved method for making printed circuit boards, which comprises:
    (a) treating an electrically non-conductive base with a solution comprising a reducible salt of a non-noble metal, selected from the group consisting of reducible salts of copper, nickel, and cobalt, a light radiation-sensitive reducing compound and a secondary reducer;
    (b) exposing the treated base to light radiant energy in selected areas to reduce the metal salt to produce a reduced metal salt species in the form of a real image corresponding to the desired circuit pattern;
    (c) treating the exposed base to remove unexposed portions of the metal salt; and
    (d) exposing the real image to an electroless metal deposition solution to deposit an electroless metal thereon, wherein the improvement comprises:
        prior to step (c), treating the exposed base with a fixing solution comprising a reducing agent selective for the non-noble metal ions of said salt, contained within the real image, selected from the group consisting of formaldehyde and paraformaldehyde when said salt is a reducible salt of copper, and formaldehyde, paraformaldehyde and a hypophosphite species when said salt is a reducible salt of nickel or cobalt, to stabilize the real image.

8. The method as defined in claim 7 which further comprises, in step (c), rinsing the base having said stabilized real image thereon with an inert rinsing agent.

9. The method as defined in claim 7 wherein:
    said reducible salt comprises a reducible salt of copper, and
    said reducing agent is selected from formaldehyde and paraformaldehyde.

10. The method as defined in claim 7 wherein said fixing solution additionally comprises a chelating agent.

11. A method for depositing a metal pattern on a dielectric surface which comprises:
    (a) treating the surface with a sensitizing solution comprising at least (1) a reducible salt of a non-noble metal, selected from the group consisting of a reducible salt of copper, a reducible salt of nickel and a reducible salt of cobalt, and (2) a light radiation sensitive reducing agent for said salt, to form a sensitized surface;
    (b) selectively exposing said sensitized surface to a source of light radiant energy to reduce said metal salt to produce a reduced metal salt species in the form of a real image corresponding to the desired metal pattern; and
    (c) treating said real image containing surface, prior to removing unexposed portions of said metal salt therefrom, with a fixing solution comprising a selective reducing agent for said non-noble metal ions of said salt contained within the real image, selected from the group consisting of formaldehyde and paraformaldehyde when said salt is a reducible salt of copper, and formaldehyde, paraformaldehyde and a hypophosphite species when said salt is a reducible salt of nickel or of cobalt, to stabilize said real image.

12. The method as defined in claim 11 wherein:
    said salt is a reducible salt of copper, and said selective reducing agent is selected from formaldehyde and paraformaldehyde.

* * * * *

UNITED STATES PATENT OFFICE
CERTIFICATE OF CORRECTION

Patent No. 4,084,023                Dated April 11, 1978

Inventor(s) Robert V. Dafter, Jr.

It is certified that error appears in the above-identified patent and that said Letters Patent are hereby corrected as shown below:

In the specification, Column 1, line 36, "been know" should read --been known--. Column 2, line 67, "circuits or" should read --circuits on--. Column 3, line 48, "a nitrates" should read --nitrates--. Column 5, line 58, "compostion" should read --composition--. Column 6, line 35, "from the" should read --for the--. Column 7, line 8, "(pH>7)" should read --(pH<7)--.

Signed and Sealed this

Fifth Day of September 1978

[SEAL]

Attest:

RUTH C. MASON
Attesting Officer

DONALD W. BANNER
Commissioner of Patents and Trademarks